United States Patent [19]

Chance et al.

[11] Patent Number: 5,292,477
[45] Date of Patent: Mar. 8, 1994

[54] SUPERSATURATION METHOD FOR PRODUCING METAL POWDER WITH A UNIFORM DISTRIBUTION OF DISPERSANTS METHOD OF USES THEREOF AND STRUCTURES FABRICATED THEREWITH

[75] Inventors: Dudley A. Chance, Newton, Conn.; David B. Goland, Bedford Hills, N.Y.; Srinivasa S. N. Reddy, LaGrangeville, N.Y.; Subhash L. Shinde, Croton-on-Hudson, N.Y.; Donald R. Wall, Wappingers Falls, N.Y.

[73] Assignee: International Business Machines Corporation, Armonk, N.Y.

[21] Appl. No.: 965,149

[22] Filed: Oct. 22, 1992

[51] Int. Cl.$^5$ ............................................. B22F 7/00
[52] U.S. Cl. ............................................. 419/9; 148/411; 252/512; 264/58; 501/11; 419/10; 419/31
[58] Field of Search .................... 419/7, 9, 23, 31, 32, 419/33, 34, 10; 501/17, 55, 60, 11; 75/246; 148/411; 252/512; 264/58

[56] References Cited

U.S. PATENT DOCUMENTS

| | | | |
|---|---|---|---|
| 1,792,262 | 2/1931 | Wilson | 420/477 |
| 3,070,436 | 12/1962 | Triffleman | 419/3 |
| 3,143,789 | 8/1964 | Iler | 75/235 |
| 3,166,416 | 1/1965 | Worn | 419/20 |
| 3,192,042 | 6/1965 | Spacil | 419/19 |
| 3,218,135 | 11/1965 | Alexander | 428/565 |
| 4,090,874 | 5/1978 | Kaufman | 75/246 |
| 4,398,969 | 8/1983 | Melton et al. | 75/235 |
| 4,443,249 | 4/1984 | Weber et al. | 75/352 |
| 4,504,017 | 3/1985 | Andrews | 241/40 |
| 4,557,893 | 12/1985 | Jatkar et al. | 419/12 |
| 4,594,181 | 6/1986 | Siuta | 252/512 |
| 4,599,119 | 7/1986 | Ikushima et al. | 148/411 |
| 4,600,604 | 7/1986 | Siuta | 428/403 |
| 4,609,525 | 9/1986 | Schreiner et al. | 419/6 |
| 4,857,266 | 8/1989 | Sheinberg et al. | 419/22 |
| 4,891,059 | 1/1990 | Diamond et al. | 75/356 |
| 5,004,498 | 4/1991 | Shimamura et al. | 75/233 |
| 5,126,915 | 6/1992 | Pepin et al. | 361/304 |
| 5,184,662 | 2/1993 | Quick et al. | 164/97 |

OTHER PUBLICATIONS

P. S. Gilman, et al. "Mechanical Alloying", Ann. Rev. Mater. Sci. 1983.
R. M. Davis et al., "Mechanical Alloying of Brittle Materials", Metallurgical Transactions A, vol. 19A, Dec., 1988, pp. 2867–2874.
R. M. Davis, "Mechanical Alloying of Brittle Components", Journal of Metals, Feb. 1987 pp. 60–61.
W. Pavinich, et al. "Fracture at Elevated Temperature", Metallurgical Transactions A vol. 8A, Dec. 1977, pp. 1917–1933.
M. F. Ashby, et al., "Fracture-Mechanism Maps and Their Construction for F.C.C. Metals and Alloys", Acta Metallurgica, vol. 27, pp. 699–729.
F. V. Lenel, "Powder Metallurgy", Metal Powder Industries Federation, pp. 13–20, 50–52.
M. F. Ashby, et al., "The Dragging of Small Oxide Particles by Migrating Grain Boundaries in Copper", Acta Metallurigica, vol. 16, 1968, pp. 1081–1092.

Primary Examiner—Donald P. Walsh
Assistant Examiner—Anthony R. Chi
Attorney, Agent, or Firm—Daniel P. Morris

[57] ABSTRACT

Methods of fabricating powders of electrically conductive particles supersaturated with grain growth control additives are described. A molten admixture of an electrically conductive material and a grain growth control additive is atomized by spraying an inert atmosphere forming fine molten particles which rapidly cool to form solid particles which are supersaturated with the grain growth control additive. The supersaturated particles are heated to form an electrical conductor having grain sizes less than about 25 microns. The supersaturated particles can be combined with a binder to form an electrical conductor forming paste. Patterns of the paste can be embedded in a green ceramic which can be sintered to form a semiconductor chip packaging substrate having electrical conductors with controlled grain size. During sintering of the combination of ceramic precursor and conductor forming paste, the grain growth control additive results in a substantially void free and crack free via filled with metal having a fine grain morphology.

26 Claims, 5 Drawing Sheets

SUPERSATURATION METHOD FOR PRODUCING METAL POWDER WITH A UNIFORM DISTRIBUTION OF DISPERSANTS METHOD OF USES THEREOF AND STRUCTURES FABRICATED THEREWITH

CROSS REFERENCE TO A RELATED APPLICATION

U.S. patent application, Ser. No. 07/874,901, filed Apr. 28, 1992, entitled, "METHOD FOR PRODUCING METAL POWDER WITH A UNIFORM DISTRIBUTION OF DISPERSANTS, METHODS OF USE THEREOF AND STRUCTURES FABRICATED THEREWITH" to S. Kang et al, assigned to the assignee of the present invention describes methods of fabricating powders of metal particles containing grain growth control additives. A powder of metal particle, e.g., copper particles, are mixed with a powder of additive particles, e.g., alumina particles. The mixture is milled in a high energy ball mill to provide metal particles having substantially uniformly distributed therein of additive particles. The ball milled powder contains elongated high aspect ratio particles. The high aspect ratio particles are reduced in size by jet impact milling. The jet impact milled powder can be used to form a conductor forming paste in the fabrication of a metallized ceramic substrate for semiconductor chip packaging application. The jet impact milled powder has particles of sufficiently small in size to fill vias between metallization layers in the green ceramic precursor to the ceramic substrate. During sintering of the combination of ceramic precursor and conductor forming paste, the grain growth control additive results in a substantially void free via filled with metal having a fine grain morphology.

FIELD OF THE INVENTION

The present invention relates to the methods of fabricating metal containing composite particles including additive particles which are substantially uniformly dispersed within a metal matrix. The dispersants control the growth of grains during sintering of a powder of the metal containing particles to a solid mass. More particularly, the present invention is directed to fabricating a multilayer metal ceramic substrate suitable for packaging microelectronic chips wherein the metal patterns are formed from powders of conducting particles containing additives which control the grain growth so that the conductors sinter substantially uniformly with the green ceramic which forms the ceramic material. Most particularly, the metal containing particles comprise copper supersaturated with an additive which is substantially uniformly dispersed on an atomic scale within the copper particles by atomization from the molten state and rapid quenching.

BACKGROUND OF THE INVENTION

Advanced high speed semiconductor chips are packaged in modules wherein the chips are physically and electrically mounted on ceramic substrates. The modules can be used as components in an electronic computer. The ceramic substrates contain a plurality of layers, each of which contains a plurality of electrical conductors. Within some of the ceramic layers there are electrically conductive vias electrically interconnecting conductors in adjacent conductive layers. The ceramic layers between the electrical conductors act as electrical insulators. These ceramic substrates are formed by laminating together thin green sheets of glass particles or an admixture of glass and crystalline particles mixed with binders. The green sheets have patterns of paste containing metal particles mixed with binders for forming conductors between the ceramic green sheets and for filling through holes in the green ceramic sheets to form conductive vias between adjacent metallization layers. The green laminate is fired to burn off the binder material; fired to densify the glass particles and metal particles to a dense state; further fired, if necessary, to crystallize the densified glass particles or to further crystallize the admixture of glass and crystalline particles to form an insulator and to coalesce the metal particles to form conductive metal lines and vias.

Ceramic module technology for high end computer packaging uses copper conductors and requires that the sintering and densification of the copper and the ceramic occur at comparable rates over a common co-sintering cycle. Since copper densification rates are usually faster than that of ceramics, a coating of fine alumina particles can be applied to the surface of the copper powder particles by a chemical reduction technique, to retard the kinetics of the copper particle densification to make it comparable to that of the ceramic material. See, for example, U.S. Pat. Nos. 4,595,181, 4,600,604 and EPO patent application 0,272,129 filed Dec. 12, 1987. Due to the small volume fraction of the alumina required, the process involves making a coated powder with large volume and area fraction coverage and mixing this powder with an uncoated powder to achieve the desired average levels of alumina coating. This leads to a problem, in that the coating can be nonuniform and hence result in severe retardation of sintering and densification in some areas and almost no retardation in others. This results in localized shrinkage mismatch, during sintering, between the copper and ceramic material resulting in copper via cracking. An electrical open associated with this cracking can occur in the worse case after complete sintering. A more insidious problem is one where the cracking is only partial after sintering and becomes complete leading to a full electrical open after the module has gone through further processing and chip attachment. Since such modules are generally not reparable they may have to be scrapped. Scrapping a fully fabricated part adds substantially to overall fabrication cost. In addition, a conductive via having a partial fracture could become an open during the operation of the electronic computer containing the module due to crack propagation and hence result in field failures.

The finely deposited alumina particles at the exterior of the copper particles serve to retard shrinkage of the copper during the sintering process of the ceramic. The alumina coating at concentrations typically achievable do not prevent grain growth of the copper during the crystallization temperatures of the ceramic materials typically used to fabricate a semiconductor chip packaging substrate. The result is copper grains which are of the order of 50-100 microns which is of the order of the cross sectional size of vias between conductive layers in the multi layer ceramic substrate. On cooling, vias which fracture or have the potential for fracture do so by the well known mechanism of intergranular creep fracture. Microvoids, which are the result of vacancy precipitation by low tensile strain rate, accumulate at grain boundaries and may extend across the via. The low imposed strain rate is caused by thermal expansion mismatch between the copper and ceramic which results in a relatively large differential size change during cool down from the relatively high sintering temperatures. In some cases large voids formed during sintering may also be found at grain boundaries.

Figure 1:
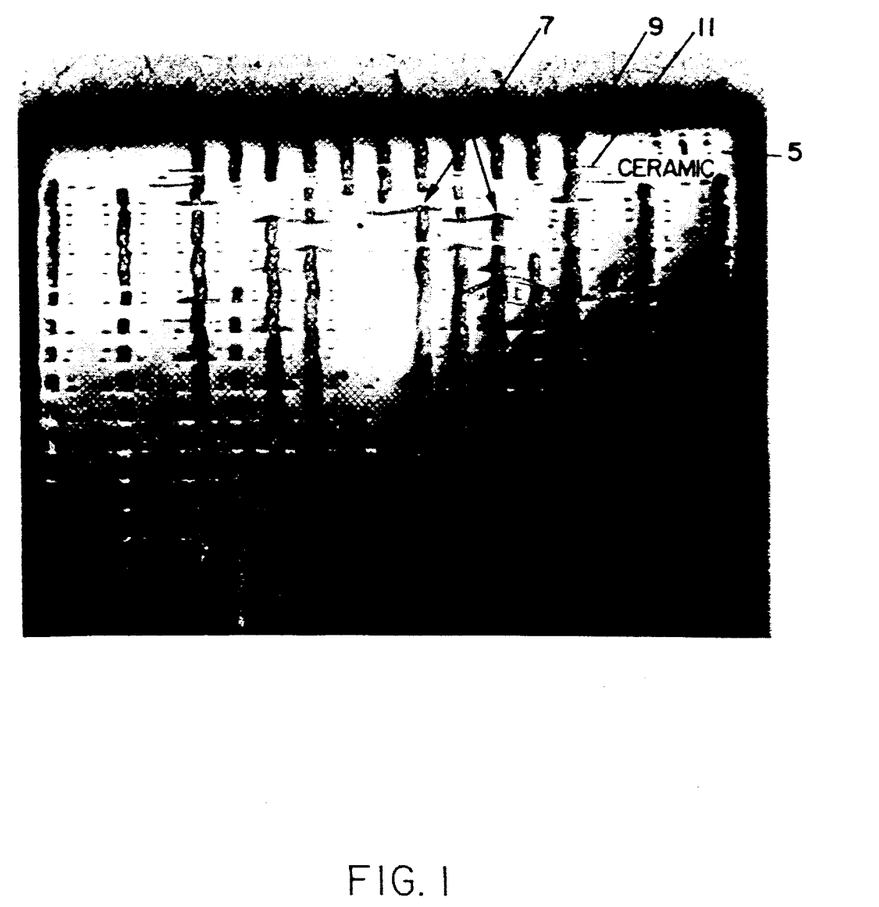
FIG. 1 shows line bending caused by sintering rate mismatch which can lead to electrical opens of metallic conductors.
Figure 2:
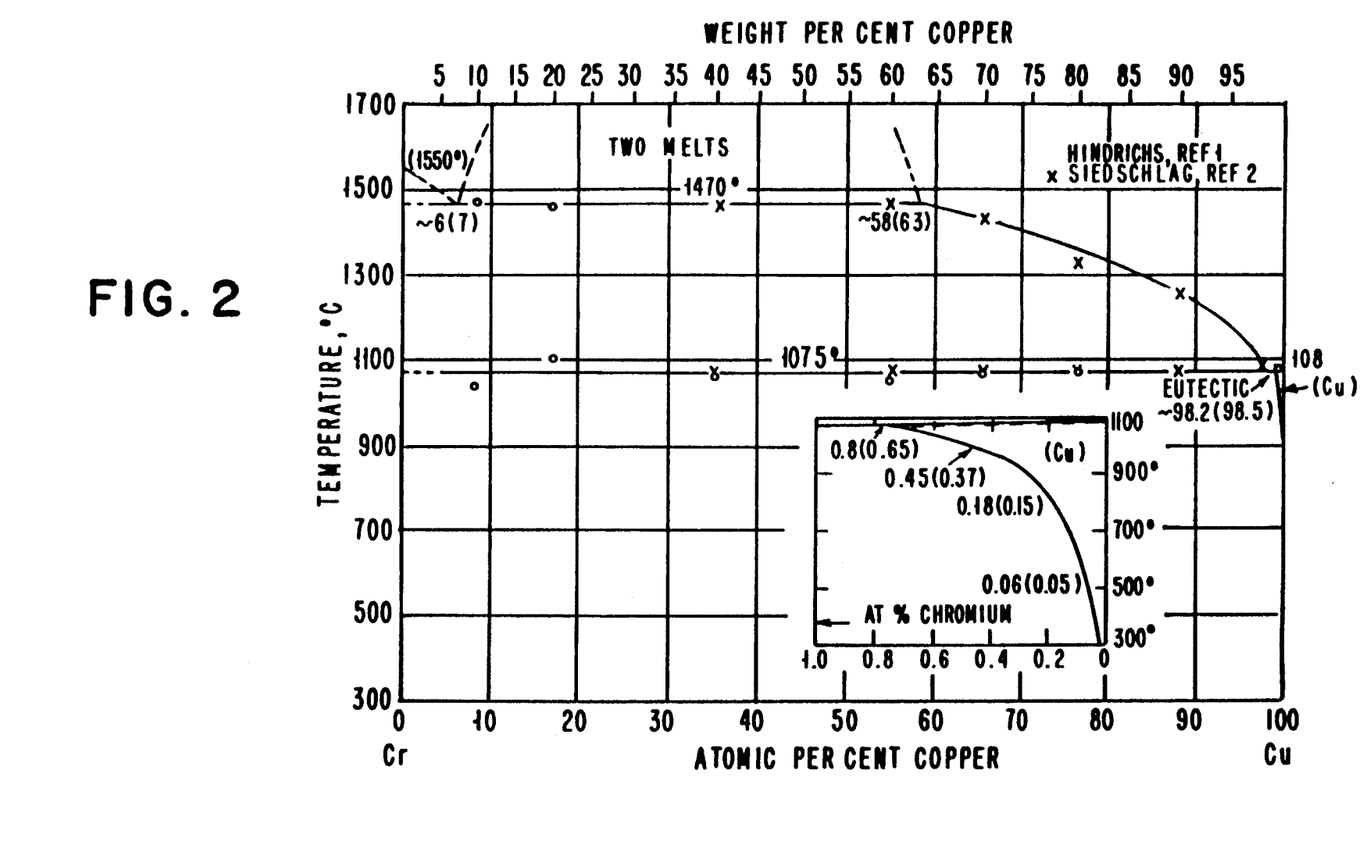
FIG. 2 shows a chromium-copper phase diagram.

Inert particulate additives ($Al_2O_3$, $TiO_2$, $CuAl_2O_4$, etc.) can control sintering rate and retard grain growth. However, it would be fortuitous if the quantities of additives for sintering control and grain size control are approximately the same so that this method can be used. It has been observed that 120 ppm of $Al_2O_3$ and 800 ppm of $TiO_2$ are sufficient for densification control but insufficient for satisfactory grain size control. Increasing the $Al_2O_3$ content to a level which may be sufficient to prevent grain growth retards the densification of the Cu too much and causes electrical opens by "line bending" as illustrated in FIG. 1. FIG. 1 shows a cross sectional view of a ceramic substrate 5 which has bent lines 7 which can cause opens in conductors 9.

Another major obstacle when using particulate additives in achieving uniform dispersion and insuring that every via has the required amount of particular additives to retard grain growth. The number of vias in the typical module is large ($\approx 10^6$) and the quantity of material in the typical via is small ($\approx 10^4$ particles). Thus, it is difficult to insure that every via has the proper quantity of additive with a high confidence level. For example, it may be necessary that each vias has from 50 to 100 particles of the additive to better that 6 sigma probability.

Forming mechanically dispersed oxide particles in Cu can also be achieved by preferred internal oxidation of a metal additive such as Al, Be, Mg, etc. to the Cu. In these cases, the oxidation process usually takes place to 950° C. and long times are required for large oxide particles to grow. Again it would be fortuitous that the controlled oxidation growth of the oxide particles to desirable proportion and sizes would match the process designed for glass ceramic sintering.

For these and other reasons related to ambient control during sintering for insuring adequate carbon burn-off and pore size control in glass ceramic, the solution requires a forgiving process not particularly dependent on temperature or ambient change.

SUMMARY OF THE INVENTION

It is an object of the present invention to provide conductive material within a via in a ceramic material wherein the conductive material is formed from grains of electrically conductive material wherein the grain size is substantially uniform and substantilly smaller than the size of the via.

If is another object of the present invention to provide conductive vias having substantially small grain size by providing in electrically conductive particles grain growth controlling additives which are substantially uniformly distributed on an atomic or molecular scale throughout the electrically conductive particles. The particles are used to form a precursor to the electrically conducting via material.

It is yet another object of the present invention to provide electrically conductive particles supersaturated with the additive to achieve grain growth control during sintering.

It is a further object of the present invention to provide the electrically conductive particles supersaturated with the growth control additives by forming a molten alloy of the electrically conductive material and additive which is quenched by spraying into an inert atmosphere to form the supersaturated particles.

It is an additional object of the present invention to provide electronic packaging ceramic substrates containing electrical conductors formed from the supersaturated metal particles.

A broad aspect of the present invention is a method of forming an electrical conductor having a substantially uniform distribution of small grain size conductive particles wherein the grains contain growth control additives.

In a more particular aspect of the method of the present invention, the grain growth control additives are substantially uniformly distributed within electrically conductive particles by forming a high molten admixture of the electrically conductive material and the additive which is rapidly cooled.

In another more particular aspect of the method of the present invention, the molten admixture is cooled by spraying into an inert atmosphere to form supersaturated electrically conductive particles.

In another more particular aspect of the method of the present invention, a pattern of an electrical conductor forming composition is formed from a powder of electrically conductive particles supersaturated with the growth control additives. The pattern is included within a green ceramic body and simultaneously sintered therewith to form a ceramic body containing electrical conductors having substantially uniformly distributed grains of small size.

In another more particular aspect of the method of the present invention, the conductor forming composition fills through-holes within the green ceramic body and are sintered to substantially crack free and void free electrically conductive vias having substantially uniformly distributed grains having a size substantially smaller than the size of the through hole.

Another broad aspect of the present invention is a ceramic structure having a cavity therein substantially filled with a conductive material having a plurality of substantially uniformly distributed grains of a dimension substantially smaller than the size of the cavity.

In a more particular aspect of the structure of the present invention, the ceramic structure contains a plurality of layers each having a plurality of electrical conductors wherein adjacent levels are interconnected by electrically conductive vias.

In another more particular aspect of the structure of the present invention, an electronic device is mounted in electrical communication with the electrical conductor containing ceramic structure.

BRIEF DESCRIPTION OF THE DRAWINGS

These and other objects, features and advantages of the present invention will become apparent upon a consideration of the following detailed description of the invention when read in conjunction with the drawing Figures, in which.

DETAILED DESCRIPTION

As described herein above, the commonly used technique of decorating copper particles with aluminum oxide particles to control copper grain growth does not repeatedly achieve the desired result of small and uniform copper grain size. This is so since copper particles with a uniform distribution of aluminum oxide (alumina) particles cannot be easily achieved.

A solution according to the present invention is a process to combine disparate materials to form fine particles of supersaturated alloys. The particles are primarily formed from electrically conducting materials such as copper or gold. These materials are supersaturated with additive materials, such as, chromium, cobalt or silicon. The additive materials are oxidizable on an atomic or molecular scale.

The choice and quantity of the additive material is determined by its solubility in the host particle material and by its effectiveness in controlling grain size in the oxidized or unoxidized form. In the preferred embodiments, the method to achieve grain growth control is preferably consistent with the process to fully sinter a ceramic or glass ceramic composition containing electrical conductors, preferably electrically conductive vias as described herein below.

Figure 3:
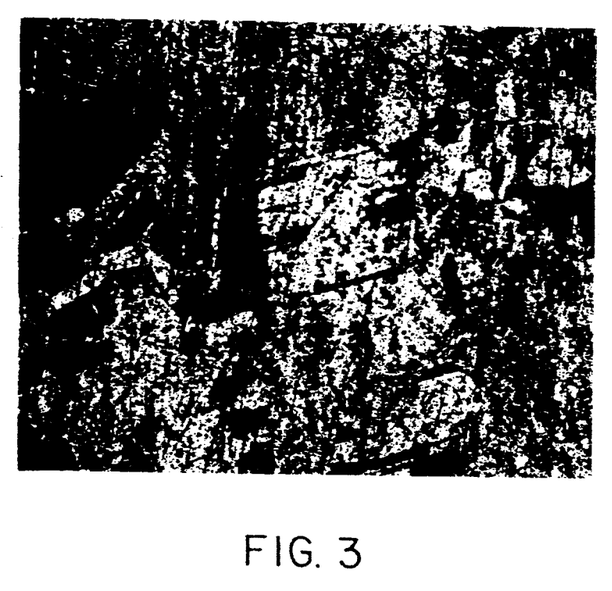
FIGS. 3, 4 and 5 show optical micrographs of the grain structure of copper formed from copper particles supersaturated with 0.5% 1.0% and 1.5% chromium respectively.
Figure 4:
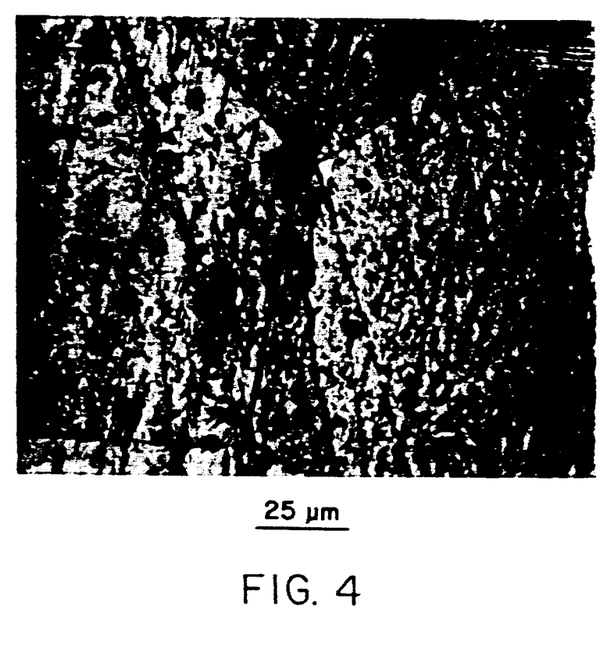
Figure 5:
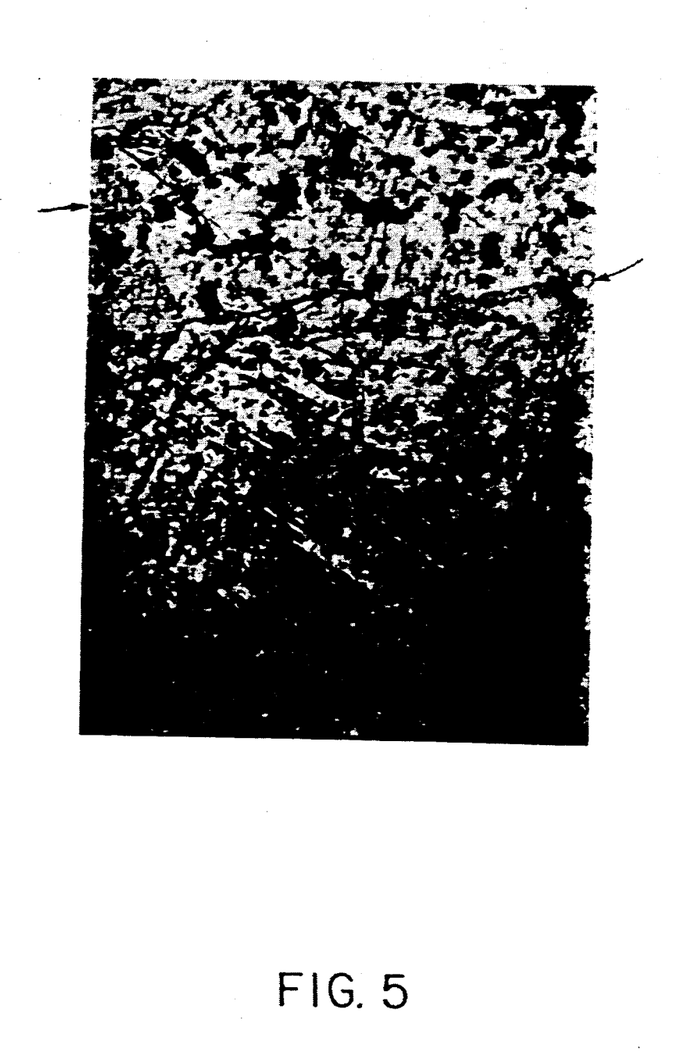

For convenience, the invention will be described with references to the preferred embodiment of copper conductor particles with chromium additive. However, it will be understood that the invention is not limited thereto. For the specific case of copper conductors formed in a cordierite ceramic as described in the example below with chromium (Cr) as an additive at concentrations of less than about 1.5% by weight, the copper grain size is controlled to be less than about 25 microns. FIGS. 3, 4 and 5 show optical micrographs of copper conductors containing 0.5%, 1.0% and 1.5% by weight Cr formed in such a process. Submicron particles of chromium oxide are shown by arrows in the FIG. 5 pinning the grain boundaries of the copper grains.

It is desirable that the Cu metallization have a composition in each via which is tailored to shrink at the same rate as the ceramic, material of a packaging substrate which is sintered to form a reliable, highly conductive, fine-grained metallurgy on cooling. Supersaturated Cu alloys which precipitate submicron particles large enough to pin grain boundaries at high temperatures and prevent crack formation in via-size grains are described herein below.

It has been discovered that supersaturated alloying which can produce a uniform retardant distribution can definitely lead to a uniform retardation of the copper densification rate. In addition, it can also produce a fine inert dispersion of the retardant in the densified copper that can mitigate the creep and cavitation processes that can occur in copper during the cool down cycle of the co-sintering process of the copper paste and green ceramic as described herein below. In effect, the particles can distribute the porosity in the copper uniformly over the entire volume of a via thus preventing the formation of coalesced large voids that can be potential locations for via opens. The pinning effect of the dispersed particles will also lead to a very fine and uniform grain size distribution in the copper that will be stable under the sintering and cool down cycle of the ceramic sintering process as described herein below.

Figure 6:
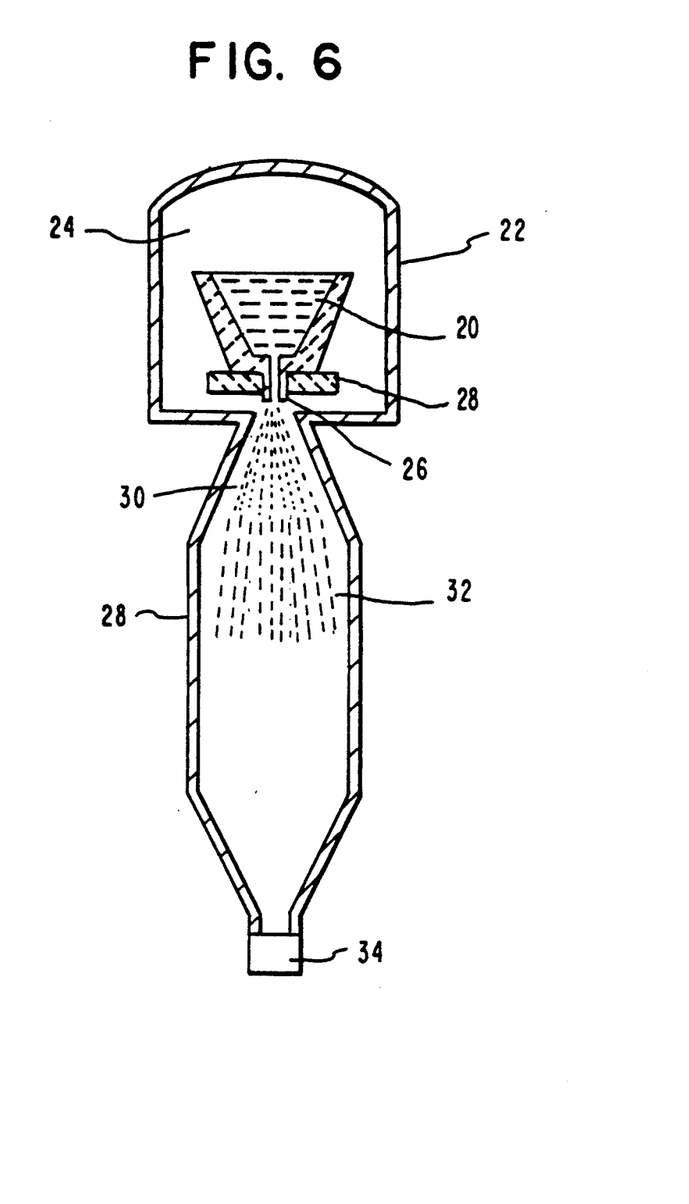
FIG. 6 is a schematic diagram of an atomizer to form supersaturated particles of the present invention.

FIG. 6 is a schematic representation of the apparatus and method for forming the supersaturated powder.

Pieces or chunks of the electrically conducting material and additive are introduced into reservoir 20. They are heated, by induction heating to melting. The eddy currents set up by induction achieve homogenous mixing of conductive material and additive. The reservoir is contained in housing 22 which contains an argon environment on the interior 24. The molten material in the reservoir 20 is fed through nozzle 26 in base 28 of reservoir 20. A high velocity argon jet impinges on the molten alloy stream. The molten material is sprayed into chamber 28 forming droplets 30 which solidify by rapid cooling to particles 32 which fall to collection chamber 24.

By example only, the Cu-1.5 wt % Cr alloy melt is heated to 1500°-1600° C. under high purity argon. The molten Cu-Cr alloy falls from the nozzle at the bottom of the melting chamber under gravity. This stream is impinged by high velocity (300-3000 ft/sec) jet of high purity argon. The molten stream is disintegrated into very tiny (0.1 to 50 $\mu$m in size) droplets which solidify immediately due to the quenching effect of the high velocity argon.

The additive material enters into the crystal lattice of the electrically conducting material substitutionally. The degree of substitution is equal to the atomic percent which the additive is of the molten admixture of the electrical conducting material and the additive. The atomic percent of the additive in the molten condition is greater than can be contained on the atomic scale for the admixture in the solid state. Therefore, if the admixture is cooled slowly precipitates of the admixture will be present in the solidified admixture. If the admixture is cooled rapidly, no precipitates of the additive will exist but the solid material will be in a supersaturated condition. Therefore, in the super saturated solid material the additive is substantially uniformly distributed throughout the solid material on an atomic scale. When the molten particles 30 are sprayed into chamber 28, they rapidly solidify to particles 32. Preferably chamber 28 contains an inner atmosphere such as argon or nitrogen.

In a preferred embodiment the particles are used to form a paste from which electrical conductors embedded within a ceramic material are formed. For this application the particles are screened preferably to select out particles between about 0.5 microns to about 10 microns. The screened particles are combined with a binder material (such as those described herein below with reference to ceramic green sheets) to form a paste. The paste is incorporated in a ceramic as described here and below. The paste and the green ceramic are co-sintered to form a ceramic structure have embedded therein electrical conductors. The binder materials in the paste and in the green sheets are burned off in an environment which is preferably sufficiently oxidizing to the additive particles so that oxide of the additive particles is preferably formed. During the process of burning out the binders the additive atoms diffuse to a nucleation site where the additive oxide particle forms a small crystallite embedded within crystalline grains of the electrically conducting material. Additive atoms diffuse towards this nucleation site and an oxidizing agent, such as oxygen diffuses from the ambient into the crystalite to form the oxide at the nucleation site. This co-diffusion of the additive and oxygen is controlled by the methods described herein. By controlling the temperature of the burnout process and by controlling the partial pressure of oxygen in the ambient where the additive is chromium, the oxide formed is $Cr_2O_3$. If there is no oxidizing agent present in the environment, the atoms and molecules will diffuse to a nucleation site where a crystallite of the additive is being formed. It has been found herein that the oxide of the additive is a preferred grain growth control agent than is a crystallite of the additive. However, a crystallite of chrome oxide has been found to control the grain growth of the host electrically conducting material. It is preferred that the oxygen in diffusion be greater than the out diffusion of the additive particles so that an additive oxide crystallite is formed within the host electrically conducting material crystallite. If the additive molecule or atom out-diffusion is greater than the oxygen in-diffusion, it is likely that on the surface of the electrically conducting material particle or crystallite there will be formed an oxide of the additive. If the electrically conducting material crystallite is surrounded by a shell of the additive or additive oxide, this will interfere with the densification of the electrically conductive particles into an electrical conductor. As described herein below, after the binders are burned off a reducing atmosphere is introduced to complete the sintering of the ceramic material. This reducing atmosphere may reduce the additive oxide particles to crystallites of the additive which continue to control the growth of the grains of the electrically conductive material particles. Where the oxide is chrome oxide, the reducing atmosphere described herein below will not reduce the chrome oxide crystallites to chrome crystallites.

After the grain growth control additive has been uniformly distributed in the conductive particles a paste can be formed by mixing the particles with a binder material as described herein below. The paste can be readily used in the screening and sintering process to achieve the controlled sintering procedure in the fabrication of a multilayer ceramic (MLC) substrate. Direct powder metallurgical sintering with or without isostatic pressure can be employed if the desired result is a structural component of a particular shape and geometry.

In a preferred embodiment the electrical conductors having grain growth control additives according to the present invention are used for electrically conductive lines and vias in a multilayer ceramic substrate on which a semiconductor chip is mounted. The process of fabricating such a substrate will be described first and the details on fabricating the powders will now be discussed.

Multi-layered ceramic circuit substrates contain patterned metal layers which act as electrical conductors sandwiched between ceramic layer which act as electrical insulators. These ceramic substrates are formed by laminating together thin green sheets of glass particles or an admixture of glass and crystalline particles mixed with binders and patterns of paste containing metal particles mixed with binder for forming conductors between the ceramic green sheet. This green laminate is fired to burn off the binder materials, fired to coalesce the particles to a dense state, further fired if necessary to crystallize the densified glass particles or to further crystallize the admixture of glass and crystalline particles to form an insulator and to coalesce the metal particles to form conducting metal lines.

Terms such as ceramic and glass ceramic are often used interchangeably in the art. To avoid confusion for the purpose of this application the following definitions will be used. The term ceramic has the following meaning: an aggregate of randomly oriented crystallites wherein the interstices between crystallites optionally contain uncrystallized material such as a glass. The terms coalescence or densification refer to a heat treatment to reduce the density of pores in green sheets. The term crystallization refers to further heating after coalescence or densification or heating if there is no coalescence or densification step, to form crystallites from a glass. The term sintering refers to the heat treatment required to form the final ceramic. Sintering of a green sheet of crystallizable glass particles is a heat treatment to coalesce or densify the green sheet plus the heat treatment to form crystallites from the glass. Sintering of a green sheet of an admixture of glass particles and crystalline particles is a heat treatment to coalesce or densify the green sheet plus a crystallizing heat treatment only if further crystallization is required. The term sintering temperature means, for a green sheet requiring crystallization, the crystallization temperature. The term sintering temperature means, for a green sheet not requiring crystallization, the coalescence temperature. The term firing means all heat treatment needed to form a ceramic body and electrical conductors therein.

Substrates made of ceramics requiring high temperatures for particle coalescence and densification such as alumina, restrict the choice of co-sinterable conducting metallurgies to high melting point metals, for example, refractory metals, such as molybdenum, tungsten, platinum, palladium or a combination of these with each other or certain other metals and precludes the use of better electrical conductors such as gold, silver and copper which have melting points less than the alumina sintering temperature. Alumina is a good insulation, has high thermal conductivity and has good strength. However, if is disadvantageous with respect to its dielectric constant and its thermal coefficients of expansion. The relatively high dielectric constant of alumina, about 10, results in unacceptable electrical signal delays since the pulse propagation speed on the transmission line formed by metal conductor embedded in the dielectric material of the substrate is inversely proportional to the square root of the material dielectric constant. The higher thermal coefficient of expansion of alumina, compared to silicon, results in shear stress in the solder joints electrically and mechanically connecting device and circuit elements on the chip to the substrate.

The material often referred to as glass-ceramic has been intensively studied in recent years for use as circuit substrates. These ceramics generally have a low dielectric constant, a low thermal coefficient of expansion which is close in value to silicon and a low sintering temperature. The low sintering temperature permits the use of low melting point metals, such as copper and noble metals, for electrical conductors. Noble metals have low resistivities similar to copper. However, copper is less expensive and therefore its use substantially reduces manufacturing cost. When copper is used as the electrical conductor, it is necessary that thermoplastic organic binder materials contained within the green sheet used to form the ceramic and contained within the paste used to form the copper conductors be burned out in an atmosphere and at a temperature wherein the copper is not substantially oxidized.

Two references, the teachings of which are incorporated herein by reference, generally describing binder burn-out and the fabrication of ceramics are U.S. Pat. No. 4,234,367 to Herron et al. and U.S. Pat. No. 4,504,339 to Kamehara et al.

A ceramic composite structure formed by the method of the present invention is useful as a substrate on which a semiconductor chip is mounted to provide electrical connection of device and circuit elements on such semiconductor chip to a support structure, such as a printed circuit board to which the substrate is electrically connected.

An object of this invention is to provide a process of manufacturing ceramic substrates suitable for packaging of electronic circuits at a temperature compatible with the metallization used to provide electrical circuit conductors. It is important that the process be performed at a temperature below the melting or sintering temperature of the metallization, such as copper, formed on or within the ceramic material. The melting point of copper is about 1083° C. If the metallization is heated excessively, it melts, disperses, or acts as a flux to the glass or melts to form a puddle on the ceramic material. If the metallization is damaged, the electrical circuits in the integrated circuit structure are destroyed, thereby destroying the value of the package. It is a prerequisite in the art of electronic circuit packaging that the ceramic materials be processed at lower temperatures compatible with preserving the metallization structures on the packages. Metals for use in packages include but is not limited to Ag, Au and Cu.

The composite structure is formed from at least one green sheet, comprised of a thermoplastic organic binder having dispersed within the binder particles of a crystallizable glass or an admixture of glass particles and crystalline particles. Commonly used ceramic binders are Butvar (registered trademark of Monsanto Inc.), poly(vinyl butyral) and poly(vinyl acetate), poly(methyl methacrylate) and cellusolve acetate. Such binders are exemplary only and not limiting.

Examples of crystallizable glasses, useful for practicing the present invention, are disclosed in U.S. Pat. No. 4,301,324 to Kumar et al, and the process for making such ceramic structure is disclosed in U.S. Pat. No. 4,413,061 to Kumar et al. The teachings of both patents are incorporated herein by reference. The disclosed ceramic structures are characterized with low dielectric constants and are compatible with circuitry of copper-based metallurgy co-sinterable therewith. These glasses have crystallization temperature in the range of about 850° C. to 970° C.

Of the two types of ceramics disclosed in the aforesaid U.S. Pat. Nos. 4,301,324 and 4,413,061, one has spodumene, $Li_2O \cdot Al_2O_3 \cdot 4SiO_2$, as the principal crystalline phase while the other has cordierite, $MgO \cdot 2Al_2O_3 \cdot 5SiO_2$, as the principal crystalline phase. A common feature of these sintered ceramics, among others, is their excellent sinterability and crystallization below 1000° C.

The terms spodumene glass and cordierite glass as used herein refer to the uncoalesced and uncrystallized glass particles. The terms spodumene ceramic and cordierite ceramic as used herein refer to the coalesced and crystallized ceramic.

The multi-layered ceramic of the present invention includes, but is not limited to, the spodumene ceramics and cordierite ceramics as described in the Kumar et al. patents.

Examples of crystalline particles useful to form an admixture of glass and crystalline particles from which a ceramic can be formed include but are not limited to cordierite, spodumen, eucriptite, borosilicate glass, lead glass, enstatite, celsian, wollastonite, willemite, anorthite, lithium disilicate, lithium metasilicate, mullite, aluminum nitride combinations thereof and combinations thereof with alumina.

The following is a list of the general formula for the predominant components of the materials mentioned above:
celsian, $BaO \cdot Al_2O_3 \cdot 2SiO_2$
anorthite, $CuO \cdot Al_2O_3 \cdot 2SiO_2$
lithium disilicate, $Li_2O_6 \cdot 2SiO_2$
lithium metasilicate, $Li_2O \cdot SiO_2$
wallastonite, $CaO \cdot SiO_2$
willemite, $2ZnO \cdot SiO_2$
eucryptite, $Li_2 \cdot Al_2O_3 \cdot 2SiO_2$
mullite, $3Al_2O_3 \cdot 2SiO_2$
enstatite, $MgO \cdot SiO_2$ The term glass ceramic means an aggregate of randomly oriented crystallites, for example, the material listed above, wherein the intersticies between crystallites may contain uncrystallized material such as glass, for example the precursor of the above listed materials.

For convenience the invention will be described with reference to a cordierite glass ceramic containing copper conductors. However, the invention is not limited thereto.

The glass particles contained in the admixture can be any glass, such as for example borosilicate glass, and lead glass which will coalesce to a dense state to encapsulate the crystalline particles.

On the surface of the green sheet is deposited a pattern of a copper-based conductor forming composition which includes a copper paste binder, for example ethylcellulose.

A second green sheet is superimposed on the first sheet to sandwich the conductor pattern therebetween. The sheets are laminated together. A multi-layered ceramic structure is formed by laminating green sheets alternately with patterns of copper-based paste between green sheets. Copper patterns separated by glass sheets are connect by through-holes or vias in the green sheets which are filled with the copper-based paste. For a ceramic structure for use as a semiconductor chip substrate, the copper pattern is extended to at least one surface of the composite structure.

Examples of illustrations of ceramics used for the preferred embodiment of this invention are the spodumene and cordierite glass formulations disclosed in the aforesaid patents to Kumar et al. The crystallization temperatures of these ceramics are in the range of about 850° C. to about 970° C. In a second firing step the laminated multi-layered glass structure is heated preferably at a rate of about 1° C. to 5° C. per minute in a reducing or neutral atmosphere to the sintering temperature.

A fired composite structure of laminated multi-layer ceramic layers with metal planes therein for use as a circuit substrate has the metal pattern extended to at least one surface of the fired laminate. An integrated circuit semiconductor chip is mounted on the laminate in electrical connection with the metal extensions.

Alternatively, on the ceramic surface to which the metal patterns extend a polymer body containing electrical conductor can be disposed. These conductors are electrically connected to the ceramic structure conductors and extend to a surface of the polymer body to which an electronic device, e.g., a semiconductor chip electrically connected as described in U.S. application Ser. No. 07/695,368, filed May 3, 1991 now U.S. Pat.

No. 5,258,236, the teaching of which is incorporated herein by reference.

EXAMPLE 1

The multi-layered substrate fabrication process involves the following illustrative basic steps.

Step 1

The cullet of the chosen crystallizable glass is a cordierite type glass disclosed in U.S. Pat. No. 4,301,324 to Kumar et al. is ground to average particle sizes in the range of 2 to 7 micrometers. The grinding can be done in two steps, a preliminary dry or wet grinding to 400 mesh particle size followed by further grinding with suitable organic binders and solvents until the average particle size is reduced to lie between 2 to 7 micrometers and a castable slurry or slip is obtained. A single stage prolonged grinding of the cullet in the medium of the binder and solvent, until the desired particles sizes are obtained can be used. In the latter case, a filtering step may be necessary to remove over-sized particles.

By way of example, a suitable binder is polyvinylbutyral resin with a plasticizer such as dipropylglycoldibenzoate (e.g. the commercial Benzoflex plasticizer of the Tennessee Products and Chemical Corp). Other suitable polymers are polyvinyl acetate, selected ones of the acrylic resins, and the like. Similarly other suitable plasticizers such as dioctylphthalate, dibutyl phthalate, and the like, can also be used.

The purpose of adding an easily evaporable solvent is (1) to initially dissolve the binder so as to enable it to coat the individual glass particles, and (2) to adjust the rheology of the slip or slurry for good castability. A particularly effective solvent for the purpose of this example are the dual solvent systems of U.S. Pat. No. 4,104,245, specifically the dual methanol/methyl isobutylketone (in a $\frac{1}{2}$ weight ratio) solvent system.

Step 2

The slip or slurry prepared as in Step 1 is cast, in accordance with conventional techniques, into thin green sheets (e.g. about 750–250 micrometers (3–10 mils) thick), preferably by doctor-blading techniques.

Step 3

The cast sheets are blanked to the required dimensions and via holes are punched through them in the required configuration.

Step 4

A metallizing paste of supersaturated copper particles formed by the method described herein above is extruded or screened into the via holes in the individual sheets.

Step 5

A suitable copper paste or ink is then screen-printed onto the individual green sheets of Step 4, in the required conductor patterns.

A plurality of sheets, prepared as in Step 5, are laminated together in registry in a laminating press;

The temperature and pressure employed for lamination should be such as to cause (1) the individual green sheets to bond to each other to yield a monolithic green substrate, and (2) to cause the green sheet to sufficiently flow and enclose the conductor patterns.

Step 7

Firing of the laminate to the sintering temperatures to accomplish binder removal, densification or coalescence of the glass particles, and conversions to a glass-ceramic by crystallization with concurrent sintering of the metal particles, in the conductor patterns, the dense copper lines and vias.

A typical firing schedule is as follows. The green laminate is heated at a rate of 5° C./min, in air to a hold temperature of 250° C. The laminate is held at this temperature for about an hour. The temperature is then increased to 750° C. in wet nitrogren and held at 750° C. for 10–20 hours in wet hydrogen. The temperature is then slowly increased to 950° C. in forming gas ($N_2$, $H_2$ mix), and held there for 2–6 hours. The crystallization of the glass takes place during the slow ramp from 750° C. and during the hold at ~950° C. The temperature is then reduced at a rate of about 5° C./min to room temperature.

While the invention has been illustrated and described with respect to preferred embodiments, it is to be understood that the invention is not limited to the precise constructions herein disclosed, and the right is reserved to all changes and modifications coming within the scope of the invention as defined in the appended claims.

EXAMPLE 2

Additives with Limited Solubility and Oxidizable (e.g. Cr)

Cu with 1.5 weight % Cr is expected to behave in the following manner. At 730° C. in the steam ambient oxidizing to Cr, the Cr in excess of saturation (about 0.12%) precipitates internally and on the surface of Cu and is oxidized. The Cr oxide on the surface of the particle forms a coating that serves to control the sintering rate of Cu. The additional Cr within the Cu grains will be oxidized to form small particles $Cr_2O_3$ which serves to retard the grain growth of Cu. The Cr after oxidation remains oxidized throughout the remainder of the sintering cycle even after the ambient is changed to forming gas.

Very little effect on electrical conductivity is anticipated since the amount of Cr remaining in solution in the Cu is small. Examples of Cr oxide controlling the particle growth of Cu is shown in FIGS. 4–6. The samples were made by melting Cu with 0.5, 1.0 and 1.5 weight % of Cr, quenching them to obtain Cu supersaturated with Cr, mechanically deforming them to insure recrystallization on reheating, and then reheating them in a temperature cycle similar to that for glass ceramic sintering. In FIG. 4, it is observed that 0.5 weight % Cr was insufficient to prevent grain growth, whereas the sample containing 1.5 weight % Cr showed good grain control within the limits required for the glass ceramic module. Grain sizes remained below 25 microns and the Cr oxide particles pinning the grain boundaries are clearly shown. It is interesting to note that the size and concentration Cr oxide particles (0.3 micron and 1 volume %) are in the desirable range for control of Cu grain size at 25 microns as determined by the ZENER relationship.

$$d_{crit} \simeq \frac{4r}{3f}$$

where, $d_{crit}$ = critical grain diameter where growth stops.
r = radius of particles on the grain boundaries, and
f = volume fraction of the particles.

EXAMPLE 3

Additives with Limited Solubility (Co, Pb, etc.) but Reducible: Co in low concentrations in Cu is expected to behave in a manner similar to Cr in cu and 730° C. by precipitating and oxidizing. When the atmosphere is changed to forming gas, however, the Co oxide is expected to be reduced back to Co particles. Co particles would then serve to control sintering and grain growth in a manner similar to Cr oxide. The solubility of Co in Cu at 730° C. is about 0.15%. But at higher temperatures some Co is expected to redissolve in Cu to the extent of its solubility about 3%. With sufficient quantity of Co it is expected that grain size control will be achievable.

EXAMPLE 4

Additives that remain Solution but Oxidizable (Al, Si, etc.). These elements are very soluble in Cu but a fraction may be precipitated from the matrix by oxidazation. Such oxide particles remain oxides in subsequent processing but are finely divided and their use for controlling the grain size of the Cu at temperatures as high as 975° C. may be difficult for grain sizes below 25 μm. With extended burnoff time at 730° C. these elements may be used for grain growth control in Cu.

We claim:

1. A method for forming an electrical conductor having controlled grain size comprising the steps of:
   providing a molten admixture of an electrically conductive material and a grain growth control additive;
   projecting a stream of said molten admixture into a cooling environment to form electrically conductive particles supersaturated on atomic scale with said additive;
   said grain growth control additive being present in said molten admixture in an amount sufficient for said particles to be supersaturated with said grain growth control additive;
   aggregating said particles to form a precursor to said electrical conductor;
   heating said precursor to density and sinter said particles to said electrical conductor comprising a plurality of electrically conductive grains having grain boundaries;
   said step of heating resulting in additive containing particles within said particles;
   said additive containing particles pinning said grain boundaries during said heating to control the grain size of said grains.

2. The method of claim 1, wherein said electrically conductive material is selected from the group consisting of copper, gold, silver and nickel.

3. The method of claim 1, wherein said additive is selected from the group consisting of chromium, cobalt, silicon and aluminum.

4. The method of claim 1, further including the step of screening said particles to select predetermined sizes of said particles.

5. The method of claim 1, wherein said step of aggregating comprises mixing said particles with a binder material to form a paste which comprises said precursor.

6. The method of claim 1, further including the step of incorporating patterns of said precursor within a green precursor to a ceramic material.

7. The method of claim 6, further including cosintering said precursor and said green precursor to form a ceramic material having said electrical conductors having controlled grain size therein.

8. The method of claim 1, wherein said step of projecting comprises spraying said molten admixture onto an inert atmosphere resulting in the formation of said electrically conductive particles.

9. The method of claim 5, wherein said binder is selected for the group consisting of Butvar, poly(vinyl butyral) and poly(vinyl acetate), poly(methyl methacrylate) and cellusolve acetate.

10. The method of claim 5, wherein said past is an electrical conductor forming composition.

11. The method of claim 1, wherein said grain size is less than about 25 μm.

12. The method of claim 1, wherein said electrically conductive material is copper and wherein said additive is chromium, wherein said chromium is from about 0.5 atomic % to about 1.8 atomic % of said mixture.

13. The method of claim 1, wherein said electrically conductive material is copper and wherein said additive is cobalt, wherein said cobalt is from about 0.5 atomic % to about 3.0 atomic % of said admixture.

14. The method of claim 1, wherein said additive is form about 0.5 atomic % to about 3 atomic % of said admixture.

15. The method of claim 10, further comprising:
   forming at least one green sheet comprised of a binder having dispersed therein particles selected from the group consisting of particles of glass and an admixture of glass particles and crystalline particles, said green sheet having a sintering temperature below the melting point of said electrical conductors;
   forming on a surface of said first green sheet a pattern of said conductor forming composition;
   superimposing a second green sheet on said surface of said first sheet to sandwich said pattern therebetween;
   laminating said superimposed sheets together to form a laminate;
   heating said laminate to a burn-out temperature and maintaining said laminate thereat for sufficient time to decompose and eliminate said binder; and
   sintering said laminate to form a ceramic structure having electrical conductors extending within the interior thereof.

16. The method of claim 15, wherein said burn-out temperature is from about 160° C. to about 450° C.

17. The method of claim 15, where said crystalline particles are selected from the group consisting of cordierite, spodument, eucryptite, enstatite, celsian, wollastinite, willemite, anorthite, lithium disilicate, lithium metasilicate, mullite, aluminum nitride, alumina and combinations thereof.

18. The method of claim 15, wherein said glass is selected from the group consisting of borosilicate glass, lead glass and precursors to cordierite, spodumene, eucryptite, enstatite, celsian, wollastinite, willemite, anorthite, lithium disilicate, lithium metasilicate, mullite, aluminum nitride, alumina and combinations thereof.

19. The method of claim 15, including providing means for extending said pattern to at least one surface of said laminate.

20. The method of claim 15, wherein said laminate is sintered in a reducing or inert atmosphere.

21. The method of claim 18, including mounting an integrated circuit chip on said surface in electrical connection to a portion of said pattern extension.

22. The method of claim 15, wherein said conductor forming composition further includes a binder.

23. The method of claim 15, wherein said glass is selected from the group consisting of crystallizable glass and uncrystallizable glass.

24. The method of claim 10, further comprising:

forming a body of a green precursor to a ceramic material;

said body containing patterns of said electrical conductor forming composition;

firing said body to form a ceramic containing electrical conductors therein.

25. The method of claim 1, wherein said electrically conductive particles are supersaturated with said additive on an atomic scale.

26. The method of claim 10, further including embedding patterns of said paste within a green ceramic body and sintering to form a ceramic body having said electrical conductors therein.

* * * * *